United States Patent

Wilcox

[15] 3,693,111

[45] Sept. 19, 1972

[54] SAWTOOTH OSCILLATOR CIRCUIT

[72] Inventor: Milton E. Wilcox, Mesa, Ariz.

[73] Assignee: Motorola, Inc., Franklin Park, Ill.

[22] Filed: Feb. 4, 1971

[21] Appl. No.: 112,708

[52] U.S. Cl.................331/111, 331/108 A, 331/143

[51] Int. Cl...............................................H03k 3/08

[58] Field of Search.........331/111, 143, 150, 108 A, 331/108 B

[56] References Cited

UNITED STATES PATENTS

| | | | |
|---|---|---|---|
| 3,156,875 | 11/1964 | Florino et al. | 331/111 |
| 3,339,155 | 8/1967 | Camenzind | 331/111 |
| 3,593,198 | 7/1971 | Karcher | 331/111 |

OTHER PUBLICATIONS

Electronics, R. Zane, pgs. 85– 86, June 14, 1965

Electronic Engineering, G. Klein et al., pgs. 388– 390, June 1967

*Primary Examiner*—John Kominski

*Attorney*—Mueller & Aichele

[57] ABSTRACT

A monolithic integrated sawtooth oscillator and vertical deflection coil driver circuit for a television receiver is disclosed. The oscillator circuit includes a static latching switch and a pair of differential switching amplifiers for controlling the operation of the latching switch in response to the charge on a saw-forming capacitor. The charge on the capacitor is controlled by a pair of current sources, one of which supplies charge to the capacitor to form the ramp for the scan portion of each cycle operation of the circuit and the other of which removes charge from the capacitor for the retrace portion of the cycle of operation of the circuit. The second current source is normally nonconductive and is switched into conduction by the operation of the switching amplifiers and static latching switch when a predetermined charge is attained by the capacitor. Also disclosed are a vertical deflection drive circuit in which the output transistors are part of the integrated circuit. The drive circuit has a provision for providing increased potential to the vertical deflection coil during the retrace portion of the cycle of operation without necessitating the handling of high voltages by the output transistors of the circuit.

11 Claims, 3 Drawing Figures

Inventor
MITON E. WILCOX
BY
Mueller & Aichele
ATTYS.

SAWTOOTH OSCILLATOR CIRCUIT

BACKGROUND OF THE INVENTION

A large number of the different circuits employed in television receivers, both black and white and color, have been provided in integrated circuit form due to the inherent advantages of such integrated circuits. In some portions of television receivers, however, it has been difficult to devise integrated circuits which can be substituted for the discrete circuits presently employed. This has been true of the vertical deflection portion of the receiver, primarily because the output or driver circuit coupled to the vertical deflection coil ordinarily must be capable of withstanding high voltages (commonly of the order of 200 volts or so) during the retrace portion of the cycle of operation of the circuit providing the deflection signals to the vertical deflection coil. Because of this high voltage handling requirement, it has been necessary to employ discrete transistors or tubes for the output driver amplifiers of the vertical circuit, since integrated circuits manufactured by presently known techniques cannot handle voltages of this magnitude without the possibility of damage to the transistors across which these voltages must appear.

Another disadvantage in implementing television vertical sawtooth oscillator circuits in integrated circuit form is that most vertical oscillator circuits require several capacitors. If several capacitors are required, a correspondingly large number of bonding pads are necessary for connection of these capacitors, located outside the integrated circuit chip, to the circuit components which are formed on or as part of the integrated circuit chip.

SUMMARY OF THE INVENTION

Accordingly, it is an object of this invention to provide an improved sawtooth oscillator circuit.

It is an additional object of this invention to provide an improved integrated sawtooth oscillator.

It is a further object of this invention to provide a sawtooth oscillator circuit requiring a minimum number of capacitors.

It is yet another object of this invention to provide a sawtooth oscillator circuit suitable for use in a television receiver as the vertical sawtooth oscillator which also is capable of providing flyback pulses properly interlaced with the sawtooth waveform.

In accordance with a preferred embodiment of this invention, a sawtooth oscillator circuit includes first and second current sources which are connected together at a junction and in series between a pair of DC supply terminals. A charge storage capacitor is coupled between the junction and the second supply terminal. A pair of switching control circuits each have an input connected to the junction and are responsive to the magnitude of the charge stored on the storage capacitor to provide outputs corresponding to different levels of charge on the capacitor. The outputs of the switching control circuits are supplied to a static latching switch which has two states of operation and which provides an output to control the conductivity of the second current source. In one of the states of operation of the latching switch, the second current source is rendered nonconductive and in the other state of operation, the second current source is rendered conductive. With the second current source nonconductive, the charge on the capacitor is controlled solely by the first current source; but when the second current source is conductive, it controls the charge on the capacitor.

When the circuit is utilized to form the sawtooth waveform for a vertical deflection circuit of a television receiver, the first current source supplies current to the capacitor to charge it; whereas the second current source is conductive to withdraw current from the capacitor to discharge it. The relative magnitudes of current conducted by the current sources are such that the current drawn by the second current source is substantially greater than the current supplied by the first current source, so that the second current source operates during the retrace interval of operation of the vertical deflection circuit of the television receiver.

DETAILED DESCRIPTION

Figure 1:
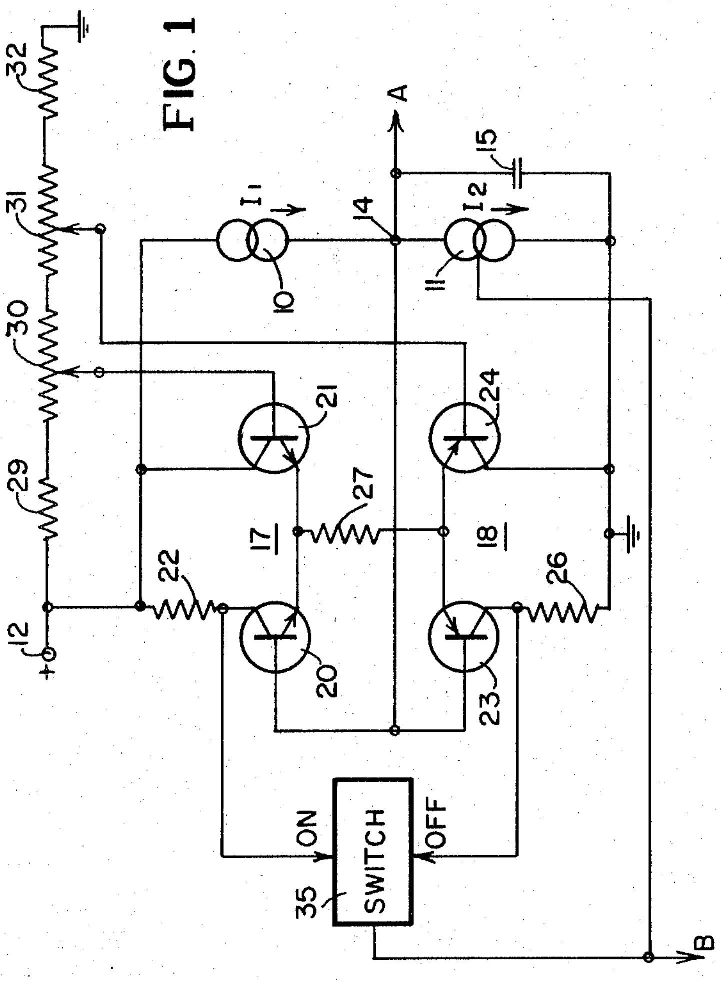
FIG. 1 is a circuit diagram of a preferred embodiment of the invention.

Referring now to FIG. 1, there is shown a sawtooth oscillator including first and second current sources 10 and 11 connected in series between a point of reference potential (ground) and a source of positive potential, shown as applied to an input terminal 12. The current sources 10 and 11 are connected together at a common junction or output terminal 14 and conduct current in the same direction between the supply terminal 12 and ground. Also connected between the junction 14 and ground is a charge storage capacitor 15 which constitutes the saw-forming capacitor for the circuit, with the output waveform for the circuit being obtained at the junction 14 and indicated as "A" in FIG. 1.

In the operation of this portion of the circuit, if the current source 11 is nonconductive or out of the circuit, it can be seen that the current source 10 supplies charging current to the capacitor 15 to charge it toward the value of the potential applied to the supply terminal 12. Now if the current source 10 is removed from the circuit and the current source 11 is reinserted into the circuit or rendered conductive, the current flowing from the capacitor 15 through the current source 11 operates to discharge the capacitor 15 toward ground potential. The same result is obtained if the current source 11 is arranged to draw a greater current than is supplied by the current source 10. Thus, even if the current source 10 is left in the circuit, the current drawn by the current source 11 discharges the capacitor 15 at a rate dependent upon the relative magnitudes of the currents supplied by the current source 10 and the current withdrawn by the current source 11. These currents are indicated in FIG. 1 as $I_1$ and $I_2$, respectively.

In order to control the charging and discharging of the capacitor 15 by the current sources 10 and 11, a pair of differential amplifier control switching circuits 17 and 18 are provided. The switching circuit 17 includes first and second NPN transistors 20 and 21, with the collector of the transistor 21 connected directly to the terminal 12 and the collector of the transistor 20 connected through a load resistor 22 to the terminal 12. Similarly, the switching circuit 18 includes a pair of PNP transistors 23 and 24, with the collector of the transistor 24 connected directly to ground and the collector of the transistor 23 connected to ground through a load resistor 26. The emitters of the transistors in the switching circuits 17 and 18 are interconnected by a common emitter load resistor 27.

The state of operation or conductivity of the transistors in the differential amplifier control switching circuits 17 and 18 is determined by the charge on the capacitor 15 which appears on the terminal 14. This terminal is connected to the bases of the transistors 20 and 23, constituting a common input to both of the switching circuits or switches 17 and 18. The input level at which the conductivity of the transistors in the differential switches 17 and 18 changes in accordance with the charge on the capacitor 15 is controlled by the potential applied to the bases of the transistors 21 and 24. These potentials are illustrated in FIG. 1 as being obtained from a voltage divider connected between the terminal 12 and ground and comprising a first resistor 29, a first potentiometer 30, a second potentiometer 31, and a second resistor 32. A tap on the potentiometer 30 is connected to the base of the transistor 21 and a tap on the potentiometer 31 is connected to the base of the transistor 24, so that the transistor 21 is supplied with a higher biasing or reference potential than is supplied to the base of the transistor 24.

Self-oscillation of the circuit shown in FIG. 1 is obtained by periodically rendering the current source 11 conductive and nonconductive in accordance with the charge attained by the capacitor 15. This is accomplished by the provision of a static latching switch 35 which is turned on when the transistor 20 of the differential switch 17 is first rendered conductive and remains on until the transistor 23 of the differential switch 18 next is rendered conductive following the conduction of the transistor 20. The output of the switch 35 is applied to the current source 11 and causes the current source 11 to be turned on or rendered conductive when the switch 35 is in its "on" state and causes the current source 11 to be rendered nonconductive or inoperative when the switch 35 is in its "off" state.

Assume that the capacitor 15 initially is in a discharged state of operation and that the switch 35 is "off." In this condition of operation, the current source 11 is nonconductive; so that current flows through the current source 10 and charges the capacitor 15 at a rate depending upon the parameters of the current source 10. Initially, the potential applied to the base of the transistor 20 is lower than that applied to the base of the NPN transistor 21; so that the transistor 21 is rendered conductive and the transistor 20 is nonconductive.

When the charge attained by the capacitor 15, and applied to the base of the transistor 20 at the junction 14, exceeds the reference potential applied to the base of the transistor 21 by an amount determined by the switching characteristics of the switching circuit 17, the transistor 20 is rendered conductive and the transistor 21 is rendered nonconductive. When the transistor 20 is rendered conductive, current flowing therethrough causes a potential drop to occur across the load resistor 22; and the negative going potential at the collector of the transistor 20 is applied to the static latching switch 35 to turn it "on".

The output of the latching switch which then is applied to the current source 11 renders the current source 11 conductive. In a typical circuit, the current $I_2$ drawn by the current source 11 is chosen to be substantially greater (10 or 20 times) than the current $I_1$ drawn by the current source 10; so that the current $I_2$ now flowing through the current source 11 effects a relatively rapid discharge of the capacitor 15. The rate of discharge is controlled by the relative magnitudes of the currents $I_1$ and $I_2$ of the current sources 10 and 11.

Shortly after the capacitor 15 begins discharging, the state of the differential switch 17 is changed back to its original condition, with the transistor 20 nonconductive and the transistor 21 conductive. Because the switch 35 is a static latching switch, however, it remains in its "on" state as the capacitor 15 continues discharging. When the charge on the capacitor 15 reaches a level where the potential at the terminal 14 is less than the reference potential supplied to the base of the transistor 24 by an amount determined by the switching characteristics of the differential amplifier switch 18, the transistor 23 is rendered conductive and the transistor 24 is rendered nonconductive. This causes a positive-going pulse transition to occur across the resistor 26, and this transition is applied to the static latching switch 35 to turn the switch "off."

The switch 35 then remains in its "off" state of operation until once again an "on" pulse transition is applied to it from the collector of the transistor 20. With the static latching switch 35, "off" the current source 11 is turned off; and the capacitor 15 once again commences charging through the current source 10 to initiate the next cycle of operation of the circuit. The range of potential through which the sawtooth waveform swings is determined by the biasing or reference potentials applied to the bases of the transistors 21 and 24, and the slope or ramp in both the charge and discharge directions for the capacitor 15 is determined by the parameters of the current sources 10 and 11. These current sources may be made adjustable, if desired, in order to provide a wide variety of output waveforms from the circuit.

Figure 2:
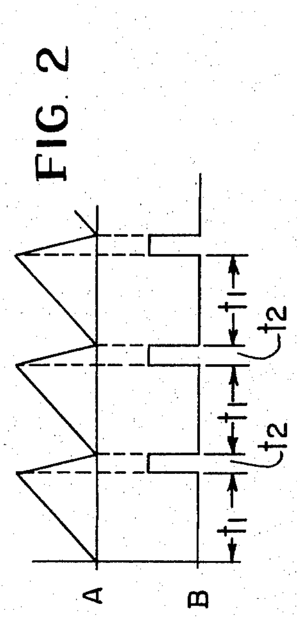
FIG. 2 illustrates waveforms useful in explaining the operation of FIG. 1.

The output signals appearing at the junction 14, and indicated as output A in FIG. 1, are illustrated in waveform A of FIG. 2. Waveform A is the result of a circuit in which the current source 11 draws substantially greater current than is supplied by the current source 10, so that the falling or retrace time for discharging the capacitor 15 is much shorter than the rising or trace portion of the operating cycle.

The output of the switch 35 appears at output B in FIG. 1 and is shown in waveform B of FIG. 2. The "off" times of the switch are indicated in waveform B by the time intervals $t_1$ and the "on" times of the switch 35 are indicated by the time intervals $t_2$. A comparison of waveforms A and B shows that the "on" times $t_2$ of the switch 35 coincide with the retrace or discharge time intervals for the capacitor 15 (waveform A). The waveforms A and B are closely interlaced and are interdependent, because the waveform B is used to control the charging and discharging of the capacitor 15 by controlling the conductive and nonconductive time intervals of the current source 11.

Figure 3:
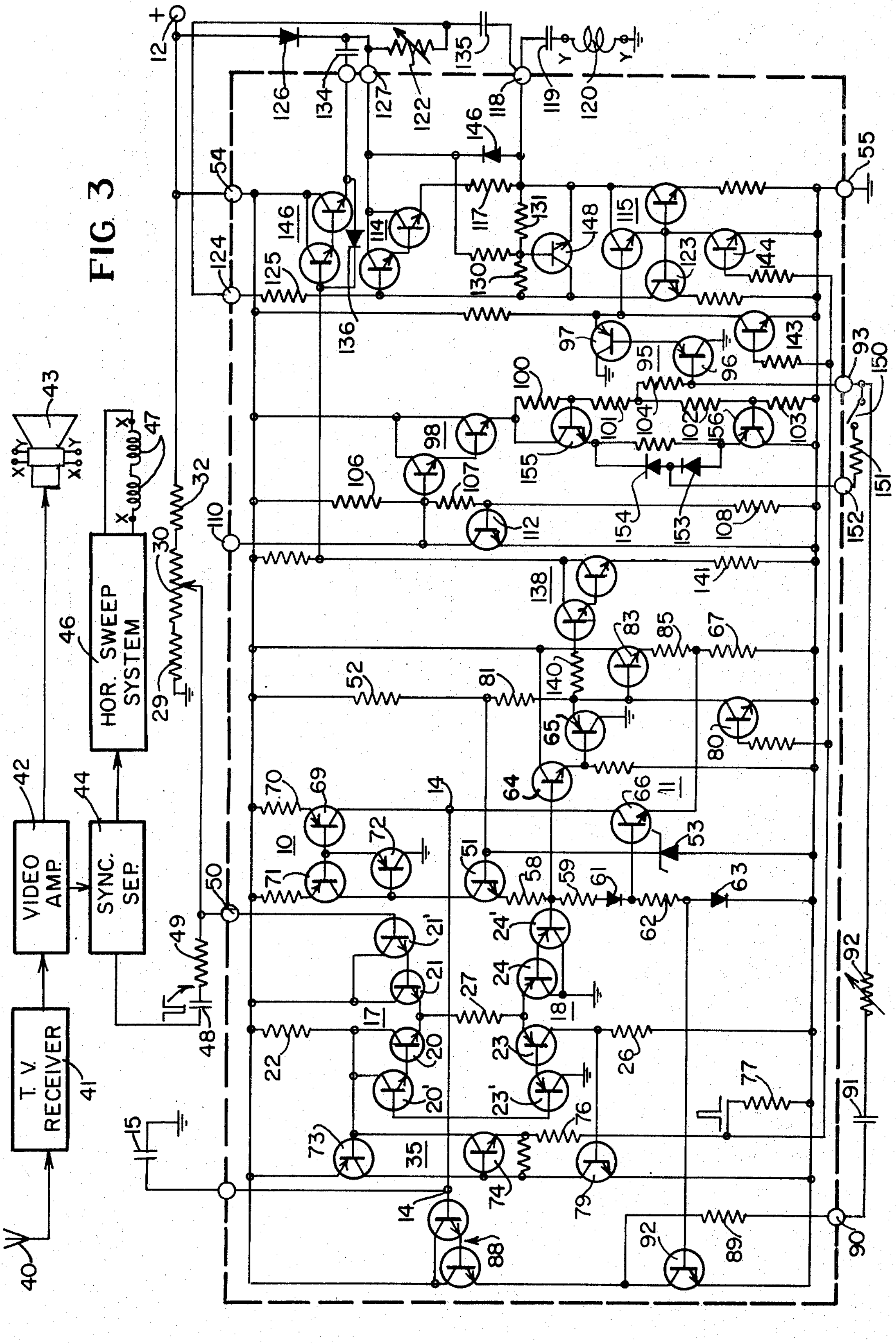
FIG. 3 is a circuit diagram, partially in block form, illustrating implementation of the basic circuit shown in FIG. 1 as part of the vertical deflection drive circuit for a television receiver.

Referring now to FIG. 3, there is shown an implementation of the circuit of FIG. 1 as part of the vertical deflection circuit of a television receiver. The television receiver of FIG. 3 is shown as including an antenna 40 which applies a received composite television signal to a receiver stage 41, which may be of conventional type and includes the RF and IF amplifier stages of the receiver along with the necessary tuning circuits. The output of the receiver stage 41 is applied to a video amplifier stage 42 which in turn supplies the video signals to a cathode ray tube 43. The video amplifier stage 42 may include the necessary video stages for a black and white receiver or the luminance and chrominance amplifier stages for a color television receiver. Since the details of these portions of the receiver are unimportant to an understanding of the vertical deflection circuit, they have not been shown in FIG. 3.

A sync separator circuit 44, which may be of conventional type, is responsive to the signals obtained from the video amplifier stage 42 and provides the horizontal and vertical synchronizing pulses derived from the received composite television signal. The horizontal synchronizing pulses are applied to a horizontal sweep system 46, which provides an output to drive the horizontal deflection coils 47 located on the deflection yoke of the cathode ray tube 44 between the points X—X indicated in FIG. 3. Similarly, vertical deflection pulses are obtained from the sync separator circuit 44 and are applied through a coupling capacitor 48 and an isolating resistor 49 to a bonding pad 50 on an integrated vertical deflection circuit, which is indicated as enclosed in the dotted lines in FIG. 3. Those components which are not formed as part of the integrated circuit, which preferably is of monolithic integrated form, are indicated on the drawing as located outside the dotted lines.

In the circuit shown in FIG. 3 the components which are the same or similar to those illustrated in FIG. 1 are shown with the same reference numbers. Thus, the integrated vertical deflection circuit shown in FIG. 3 includes first and second current sources 10 and 11, along with first and second differential amplifier control switches 17 and 18 and a static latching switch circuit 35. The differential control switches 17 and 18 operate in the same manner as those indicated in FIG. 1, but instead of a single pair of transistors for each of the differential switches 17 and 18, the transistors shown in FIG. 1 each have been replaced with a Darlington pair. The additional transistor of each Darlington pair is provided with the same reference number but primed; so that, for example, the transistor 20 is replaced with a Darlington pair including two transistors 20 and 20' for the differential amplifier switch 17. A comparable Darlington circuit configuration is provided for each of the other transistors 21, 23 and 24 shown in FIG. 1.

To provide temperature and voltage stabilized operating or reference biases for the oscillator circuit, a voltage divider in the form of a resistor 52 and a zener diode 53 is connected in series between the B+ supply, obtained from the terminal 12 at a B+ input bonding pad 54, and a grounded bonding pad 55. The zener diode 53 produces a relatively constant voltage thereacross with this voltage being applied to the base of an NPN reference transistor 51, the emitter of which is connected to a further voltage divider comprising a pair of resistors 58 and 59, a diode 61, another resistor 62, and a further diode 63 connected in series in the order named from the emitter of the transistor 51 to the ground bonding pad 55. The two diodes 61 and 63 provide temperature compensation for the zener diode 53, and the tap between the resistors 58 and 59 is connected to the base of the transistor 24' to provide a voltage and temperature stabilized reference potential for the differential control switch 18. This reference potential establishes the lower switching level of the switch 18 to constitute the lowermost point of the sawtooth waveform produced by the circuit.

The operating potential for determining the current drawn by the current source 11 is obtained from the junction of the diode 61 with the resistor 62 and is applied to the base of an NPN current source transistor 66, the collector of which is connected to the output junction 14 and the emitter of which is connected through a load resistor 67 to the grounded bonding pad 55. In addition to providing part of the temperature compensation for the zener diode 53, the diode 63 also provides temperature compensation for the base-emitter junction of the transistor 66.

The current source 10 includes a lateral PNP transistor 69, the emitter of which is connected through a load resistor 70 to the bonding pad 54. The base of the transistor 69 is provided with an operating bias by means of a pair of PNP transistors including a lateral PNP transistor 71 and a substrate PNP transistor 72, with the collector of the transistor 71 being connected to the base of the transistor 72 and to the collector of the reference transistor 51. The emitter of the substrate PNP transistor 72, in turn, is connected back to the bases of both of the transistors 69 and 71; so that when the transistor 51 is rendered conductive, the transistor 72 in turn conducts to render both of the transistors 69 and 71 conductive. The transistor 71 provides current for the voltage divider string 58 to 63 which causes a stabilized potential to be applied to the base of the transistor 72 to cause the transistor 69 to be operated as a voltage and temperature stabilized constant current source.

The operation of the circuit described thus far is the same as the operation of the circuit shown in FIG. 1 to control the state of the static latching switch 35. The latching switch includes a lateral PNP transistor 73 and an NPN transistor 74, the collectors and bases of which are interconnected with one another. The emitter of the transistor 73 is connected to the bonding pad 54 and the base is connected to the junction of the collector of the transistor 20 with the load resistor 22 to constitute the "turn on" input for the static latching switch 35. To complete the operating circuit for latching switch 35, the emitter of the transistor 74 is connected through a pair of emitter load resistors 76 and 77 to the grounded bonding pad 55.

The other or "turn off" input to the static latching switch 35 is effected by means of an additional NPN transistor 79, the base of which is connected to the junction of the collector of the transistor 23 with the load resistor 26, and the collector of which is connected to the base of the transistor 74. The emitter of the transistor 79 is connected to the grounded bonding pad 55.

With the transistor 23 nonconductive (which is the case when a ramp or charge is being built up on the capacitor 15), the transistor 79 is nonconductive. As a consequence, when the transistor 20 is initially rendered conductive, the negative-going potential appearing at its collector biases the transistor 73 into conduction. This in turn biases the transistor 74 into conduction, causing the latching switch 35 to be placed in its "on" state of operation. Due to the fact that the transistor 74 then is conducting current through the load resistor 22, the static latching switch 35 remains in this "on" state of operation irrespective of a change of state of operation of the differential switch 17 in which the transistor 20 may be rendered nonconductive.

When the charge on the capacitor 15, however, is reduced to the point that the transistor 23 is rendered conductive, as described previously in conjunction with FIG. 1, the current flowing through the resistor 26 becomes sufficient to forward bias the transistor 79 into conduction. This causes the potential on the base of the transistor 74 to drop to near ground potential, causing the transistor 74 to be biased into nonconduction. At the time that the transistor 23 is rendered conductive, the transistor 20 of the differential switch 17 also is nonconductive; so that when the transistor 74 becomes nonconductive, the transistor 73 likewise is rendered nonconductive. This is the "off" stable state of operation of the latching switch 35. As the capacitor 15 commences recharging, the transistor 23 becomes nonconductive, as described previously, which once again returns the transistor 79 to a nonconductive state. This, however, has no affect on the operation of the latching switch transistor 73 and 74, which remain nonconductive until the transistor 20 of the differential switch 17 once again is rendered conductive. Thus, it can be seen that the transistors 73 and 74 operate in the manner of a silicon-controlled switch or silicon-controlled rectifier in response to the changes of state or switching of the differential control switches 17 and 18.

Control of the operation of the current source transistor 66 is effected by coupling the output of the static latching switch 35, obtained from the junction of the resistors 76 and 77, to the base of an NPN control switching transistor 80, the emitter of which is connected to the grounded bonding pad 55 and the collector of which is connected to the bonding pad 54 through the resistor 52 and an additional resistor 81. The junction between the collector of the transistor 80 and the resistor 81 is connected to the base of an additional NPN transistor 83, the collector of which is connected to the bonding pad 54, and the emitter of which is connected through a resistor 85 to the junction of the emitter of the current source transistor 66 with the resistor 67. The junction between the collector of the transistor 80 and the resistor 81 is further connected to the emitter of a substrate PNP transistor 65 to provide a temperature stabilized operating potential from the emitter of an NPN transistor 64 while the transistor 80 is rendered nonconductive. This result is obtained since the base of the transistor 64 is provided with a temperature stabilized potential from the junction of the resistors 58 and 59.

During the "off" stable state of operation of the static latching switch 35, no current flows from the emitter of the transistor 74; so that the potential on the base of the transistor 80 is near ground potential and is insufficient to forward bias this transistor. Thus, the transistor 80 is nonconductive which causes a relatively high potential to appear on its collector, forward biasing the transistor 83 into conduction. The parameters of the circuit are selected so that the current flowing through the transistor 83 is sufficient to reverse bias the NPN current source transistor 66, thereby causing the transistor 66 to be rendered nonconductive. With the transistor 66 nonconductive, the transistor 69 supplies charging potential to the capacitor 15 at a rate determined by the parameters of the current source 10.

As soon as the latching switch 35, however, is placed in its "on" state of operation with the transistors 73 and 74 conductive, the potential at the junction of the resistors 76 and 77 rises to a point sufficiently high to forward bias the transistor 80. This causes the transistor 83 to be biased to nonconduction, which then removes the reverse bias on the emitter of the transistor 66, permitting it to conduct. The parameters of the current sources 10 and 11 are selected so that the current source 11 draws substantially more current than is supplied by the current source 10. Preferably the current drawn by the current source transistor 66 is of the order of 20 times greater than the current supplied by the current source transistor 69. As a consequence, a relatively rapid discharge of the capacitor 15 takes place through the current source transistor 66, and this constitutes the retrace interval of the vertical sweep cycle as indicated in FIG. 2 during the time intervals $t_2$. The synchronizing pulses applied to the bonding pad 50 from the output of the sync separator 44 merely insure that the operation of the oscillator circuit is in synchronism with the received television signal and cause the transistor 21 to be turned off when a synchronizing pulse appears at the bonding pad 50. This causes the transistor 20 to be turned on to initiate the retrace cycle in synchronism with the received sync pulses.

The sawtooth output provided by the capacitor 15 and appearing at the junction 14 is applied through an NPN Darlington amplifier 88 and a coupling resistor 89 to an output bonding pad 90. The collectors in the Darlington amplifier 88 are connected to the bonding pad 54, and the emitter of the output transistor thereof is coupled to the grounded bonding pad 55 through the collector-emitter junction of an NPN transistor 92, the base of which is connected to the junction of the resistor 62 with the diode 63, causing the transistor 92 to be forward biased into conduction.

The sawtooth output signals appearing on the output bonding pad 90 are connected through an external coupling capacitor 91 and a coupling resistor 92 to a vertical height input bonding pad 93, constituting the input for the vertical output amplifier section of the integrated circuit shown enclosed in the dotted lines. Input signals appearing on the bonding pad 93 are applied to the base of an input transistor 96 of a PNP Darlington amplifier 95, comprising a pair of PNP substrate transistors, 96 and 97, respectively. In addition, the quiescent DC operating point for the output stage also is applied to the base of the transistor 96 by means of a reference voltage divider controlled by the output of an NPN Darlington amplifier 98, the collectors of which are connected to the bonding pad 54 and the emitter of the output transistor of which is connected through four series-connected resistors 100, 101, 102, and 103 to the grounded bonding pad 55. The junction between the resistors 101 and 102 is connected to the base of the transistor 96 through a coupling resistor 104.

The nominal quiescent DC level is obtained from the voltage applied to the terminal 12 by means of a resistive divider comprising three resistors 106, 107 and 108 connected between the bonding pads 54 and 55, with the junction between the resistors 106 and 107 being connected to the base of the input transistor of the amplifier 98. In the absence of any additional control, it can be seen from the circuit just described that the quiescent DC level of the output stage of the circuit would be dependent upon variations in the voltage applied to the bonding pad 54, causing variations in the potential appearing at the junction of the resistors 106 and 107 and which would reflect by corresponding variations in potential at the junction of the resistors 101 and 102.

To provide means for adjusting the quiescent DC output level at a point which is not solely dependent upon the value of the potential applied to the bonding pad 54, an additional bonding pad 110 is connected to the junction of the resistors 106 and 107. By providing this additional bonding pad, an additional voltage divider may be connected thereto to vary the potential applied to the base of the input transistor of the Darlington pair 98. The bonding pad 110 could be connected to the supply terminal 12 through a suitable additional external resistor or it could be connected through an additional resistor to the bonding pad 55 in order to provide a wide range of DC quiescent levels, irrespective of the particular operating potential which is applied to the bonding pad 54 of the chip. In addition, the bonding pad 110 provides a point where a ripple filter capacitor can be connected to filter out variations in the potential applied to the bonding pad 54; so that these variations are not coupled through to the output of the circuit.

Also connected to the quiescent level determining point at the base of the input transistor of the Darlington 98 is the collector of an NPN protection transistor 112, the emitter of which is connected directly to the grounded bonding pad 55 and the base of which is connected to the junction of the resistors 107 and 108. Under normal conditions of operation, insufficient potential is developed across the resistor 108 to forward bias the transistor 112 into conduction; so that it remains nonconductive and has no effect on the operation of the circuit. The transistor 112, however, is physically located near the output side of the chip, which is the portion of the chip handling the highest currents and therefore subject to overload which could result in overheating of the chip. If the circuit is overheated to a sufficient extent, it is possible that the transistors could be destroyed, thereby rendering the chip useless.

The transistor 112 provides for an overheating protection inasmuch as when the temperature on the chip rises, the potential necessary to forward bias the transistor 112 into conduction drops, due to the negative temperature coefficient of the base-emitter junction. Thus, the potential across the resistor 108 which is required to forward bias the transistor is reduced. Eventually if the temperature continues rising the point is reached where the transistor 112 is biased into forward conduction. The potential on its collector then is pulled down toward ground, reducing the potential at the base of the Darlington pair 98. When this potential is pulled down, the quiescent operating potential applied to the base of the input transistor 96 also is reduced. This causes the current in the output stage to be reduced and the power dissipation also is reduced. This in turn causes a reduction in the heat generated by the output stage, so that the temperature there is reduced by pulling the output current down. As a consequence, the transistor 112 operates to provide temperature overload protection for the chip whether or not the chip is used with a heat sink.

The output driving stage for the vertical deflection yoke basically comprises a pair of NPN Darlington stages 114 and 115. The input to the amplifier 115 is connected to the emitter of the transistor 97. The emitter of the output transistor of the Darlington pair 114 is coupled through a resistor 117 to an output bonding pad 118 which is connected to the upper end of a coupling capacitor 119 connected in series with the vertical deflection coil 120, the other end of which is connected to ground. The output bonding pad 118 also is connected to the collector of the output transistor of the Darlington pair 115, and the deflection coil 120 is connected in the deflection yoke for the cathode ray tube 43, as indicated by the terminals Y—Y in FIG. 3.

When the scan or trace portion of the cycle of operation of the circuit is initiated the input applied to the base of the transistor 96 is at its lowest level on the rising portion of the waveforms shown in FIG. 2. The upper Darlington pair 114 of the output stage is provided with an initial DC bias level obtained from a capacitor 135, the upper end of which is connected in series with a variable resistor 122 to the bonding pad 127 and the lower end of which is connected to the output bonding pad 118. The potential on the capacitor 135 is coupled to a bonding pad 124 which in turn is connected to a resistor 125 to the base of the input transistor of the Darlington pair 114. This potential is sufficient to bias the Darlington pair 114 to a maximum state of reduction, so that current is supplied from the terminal 12 through the output transistor of the Darlington pair 114 and through a coupling diode 126 located externally of the chip. The anode of the diode 126 is connected to the terminal 12 and the cathode is connected to a bonding pad 127, which in turn is coupled to the collector of the output Darlington transistor 114. Thus, current flows from the positive supply terminal 12, through the diode 126, the Darlington output transistor 114, the resistor 117 and the capacitor 119 through the coil 120.

As the sawtooth waveform ramp increases in magnitude, however, an increasing positive potential is applied to the base of the input transistor of the Darlington pair 115, thereby causing the conduction of the Darlington pair 115 to gradually increase from a minimum amount (with the Darlington pair 115 nonconductive) on up toward some maximum amount. At the beginning of the scan or trace interval the top Darlington pair 114 is delivering all of the current into the bonding pad 118 and through the deflection coil 120. As the bottom Darlington pair 115 is rendered increasingly conductive, it diverts an increasing amount of this current from the bonding pad 118 to cause the current supplied to the deflection coil 120 to continuously decrease from a maximum amount. At the same time, conduction of the input transistor in the pair 115 increases to drive a control transistor 123 increasingly conductive to reduce the bias on the input of the Darlington pair 114.

When the Darlington pair 115 is drawing the same amount of current that is supplied by the Darlington pair 114, all of the current supplied by the Darlington pair 114 flows through the Darlington pair 115, and no current is left to go through the coil 120. This corresponds to a coil current of zero at the center of the picture displayed of the screen of the cathode ray tube. As the conductivity of the lower Darlington pair 115 continues to increase, the conduction of the upper pair 114 continues to decrease, and current flows out of the coil 120 into the bonding pad 118 and through the Darlington pair 115 to cause the vertical deflection of the beam in the cathode ray tube to increase toward the bottom of the screen. At the end of scan, the bottom Darlington pair 115 is taking all of the current out of the coil, the top Darlington pair 114 is biased to nonconduction by the transistor 123. The circuit then is ready for the flyback interval.

During this scan interval, a voltage boost capacitor 134 also is being charged by a current flowing from the terminal 12 through the diode 126, the capacitor 134, an additional diode 136, and the output transistor of an NPN Darlington pair 138 which is rendered conductive during the scan intervals by the positive potential appearing on the collector of the transistor 80 connected to the base of the input transistor of the Darlington pair 138 through a coupling resistor 140. The emitter of the output transistor of the Darlington pair 138 is connected through a load resistor 141 to the grounded bonding pad 55.

When the reset or flyback pulse is obtained from the junction of the resistors 76 and 77, as described previously, this positive pulse renders the transistor 80 conductive. This in turn causes the Darlington pair 138 to be rendered nonconductive. At the same time, this positive pulse is applied to the base of an additional pair of NPN control transistors 143 and 144 to render these transistors conductive. The collector of the transistor 143 is connected to the junction of the emitter of the transistor 97 and the base of the input transistor of the Darlington pair 115 to cause this junction to be driven to near ground thereby rendering the Darlington pair 115 nonconductive and nonresponsive to input signals. Ground potential also is applied by the collector of the transistor 144 to the base of the transistor 123, rendering the transistor 123 nonconductive. When this occurs, the potential on the base of the input transistor of the Darlington pair 114 rises to its maximum amount, thereby biasing the Darlington pair 114 into a state of full conduction.

Simultaneously, since the current path which existed for current flow out of the coil 120 just prior to the flyback pulse now has been terminated, the current flow out of the coil 120 continues and is provided with a path through a damping diode 146, the bonding pad 127, the capacitor 134, the diode 136 and the base-collector path of the input transistor of an NPN Darlington pair 146, the collectors of which are connected to the positive bonding pad 54. The Darlington pair 146 also is rendered conductive at this time due to the positive potential appearing on the collectors of the Darlington pair 138 which are connected to the base of the input transistor of the Darlington pair 146. This damping circuit prevents the application of a high reverse voltage across the emitter-collector junction of the output transistor of the Darlington pair 114 and permits dissipation of the current flow in the coil 120 due to the continued collapse of flux therein. This constitutes the first step in the flyback or retrace cycle of operation of the circuit and the current rapidly dissipates to zero.

The current then quickly builds up in the opposite direction flowing into the coil 120 due to the fact that the Darlington pair 146 is now conductive causing the charge on the capacitor 134 to rise to nearly twice that of the supply voltage, with this potential effecting a rapid retrace of the beam in the cathode ray tube 43 due to the rapid build up of current into the coil 120 through the Darlington stage 114. At the end of retrace, the Darlington pair 146 once again becomes nonconductive, with the Darlington pair 138 becoming conductive; and the foregoing cycle of operation is repeated.

In order to effect short circuit protection for the chip in the event the output terminal 118 is shorted to ground, an NPN protection transistor 148 is provided. The base of the transistor 148 is connected to the junction between a pair of resistors 130 and 131 and the collector-emitter path is connected between the base of the input Darlington transistor 114 and the output bonding pad 118. If the bonding pad 118 is connected to ground, current flows through the resistors 125, 130 and 131 to the grounded bonding pad 118. This causes a forward biasing potential drop to occur across the resistor 131; so that the transistor 148 (which is normally nonconductive) conducts to apply a near ground potential to the base of the Darlington pair 114, rendering it nonconductive. Therefore current ceases to be drawn by the Darlington pair 114 and overload protection has been effected.

The circuit described thus far provides a linear drive to the deflection coil 120; but, as is well known, in the operation of the vertical deflection coil for a television receiver, a nonlinear current must be applied to the deflection coil to compensate for the differences in the deflection angle as the beam is swept from top to bottom across the display screen of the cathode ray tube. The correction which is employed is commonly referred to as "S" correction. An "S" correction circuit for the linear ramp of the sawtooth waveform in the circuit shown in FIG. 3 is accomplished by closing a switch 150 to connect the input bonding pad 93 through a coupling resistor 151 to an "S" correction input bonding pad 152.

The bonding pad 152 is connected to the junction between a pair of series-connected diodes 153 and 154 which are coupled by way of the emitter-base junctions of an NPN transistor 155 and a substrate PNP transistor 156, respectively, to the junctions of the resistors 100, 101 and 102, 103. The transistors 155 and 156 merely are provided in the circuit to provide temperature compensation for the diodes. Thus the diodes 153 and 154 effectively are connected in shunt between the junction of the resistors 102 and 103 and the junction of the resistors 100 and 101. For the maximum and minimum extremes of the input ramp waveform, one or the other of the diodes 153 and 154 is rendered conductive to thereby change the impedance seen by the waveform at the bonding pad 93 to provide the desired "S" correction to the sawtooth waveform applied thereto. If such correction is not wanted, the switch 150 can be opened and the "S" correction circuit is disabled.

I claim:

1. A monolithic integrated oscillator circuit suitable for use in producing a sawtooth output for driving the vertical deflection yoke of a television receiver and also for providing flyback pulses during the retrace operation thereof including in combination:

first and second supply terminals for connection across a source of DC operating potential;

a first current source including a first current source transistor of one conductivity type, having base, collector, and emitter electrodes;

a second current source including a second current source transistor of an opposite conductivity type to the conductivity type of the first current source transistor, and having collector, base and emitter electrodes;

circuit means connecting the emitter of the first current source transistor with the first supply terminal;

circuit means connecting the emitter of the second current source transistor with the second supply terminal;

means interconnecting the collectors of the first and second current source transistors together at a first junction;

means for providing operating potential to the bases of the first and second current source transistors to control the conductivities thereof;

a charge storage capacitor connected between the first junction and the second supply terminals;

a first differential amplifier switch including third and fourth transistors of the same conductivity type as the second current source transistor, the third and fourth transistors each having collector, base and emitter electrodes, with the emitters of the third and fourth transistors being connected together in common;

a second differential amplifier switch including fifth and sixth transistors of the same conductivity type as the first current source transistor, the fifth and sixth transistors each having collector, base, and emitter electrodes, with the emitters thereof being connected together in common;

means for supplying first and second predetermined DC potentials to the bases of the fourth and sixth transistors, respectively;

means coupling the bases of the third and fifth transistors with the first junction;

common impedance means interconnecting the emitters of the third and fourth transistors with the emitters of the fifth and sixth transistors;

circuit means for coupling the collectors of the third and fourth transistors with the first supply terminal;

circuit means coupling the collectors of the fifth and sixth transistors with the second supply terminal;

static latching switch means having first and second inputs, with the first input coupled to the collector of one of the third and fourth transistors and the second input coupled to the collector of one of the fourth and fifth transistors; the static latching switch assuming either of two stable states of operation in response to inputs applied thereto from the first and second differential amplifier switches, respectively; and means coupling the output of the static latching switch means with the second current source transistor to render the second current source transistor nonconductive for one of the stable states of operation of the static latching switch and for rendering the second current source transistor conductive for the other of the stable states of operation of the static latching switch.

2. The combination according to claim 1 wherein the potential applied to the first supply terminal is positive with respect to the potential applied to the second supply terminal, the first current source transistor and the fifth and sixth transistors are PNP transistors, the second current source transistor and the third and fourth transistors are NPN transistors, the DC potential applied to the base of the fourth transistor is positive relative to the DC potential applied to the base of the sixth transistor, and the magnitude of current drawn by the second current source transistor when it is conductive is greater than the current supplied by the first current source transistor to the capacitor.

3. The combination according to claim 2 wherein the bases of the first and second current source transistors and at least the base of the sixth transistor are supplied from a voltage and temperature stabilized voltage reference circuit coupled between the first and second supply terminals.

4. The combination according to claim 2 wherein the static latching switch includes a latching switch PNP transistor and a latching switch NPN transistor each having collector, base and emitter electrodes, with the emitter of the latching switch PNP transistor being connected to the first supply terminal, the collector of the latching switch PNP transistor being coupled to the base of the latching switch NPN transistor, and the collector of the latching switch NPN transistor being coupled to the base of the latching switch PNP transistor; the combination further including first load resistor connected between the first supply terminal and the collector of the third transistor; a second load resistor connected between the collector of the fifth transistor and the second supply terminal, the collector of the third transistor being connected to the base of the latching switch PNP transistor; an NPN control transistor having collector, base and emitter electrodes, the base of which is connected to the collector of the fifth transistor, the collector of which is connected to the base of the latching switch NPN transistor, and the emitter of which is connected with the second supply terminal; and resistance means coupled between the emitter of the latching switch NPN transistor and the second supply terminal, the emitter of the latching switch NPN transistor constituting the output of the static latching switch.

5. The combination according to claim 4 further including control switch means coupled with the emitter of the latching switch NPN transistor for applying a reverse biasing potential to the emitter-base junction of the second current source transistor, with the latching switch transistors being nonconductive and operating to remove said reverse biasing potential therefrom with the latching switch transistors being conductive.

6. The combination according to claim 5 further including means coupled to the first junction for providing sawtooth signals from the oscillator and wherein signals appearing on the emitter of the latching switch NPN transistor constitute flyback pulses interlaced with the sawtooth waveform appearing at the first junction.

7. A sawtooth oscillator circuit including in combination:

first and second direct current supply terminals;

first and second current sources connected together at a first junction and in series between the first and second direct current supply terminals;

charge storage means coupled between the first junction and the second supply terminal;

first and second differential switching amplifiers, each having first and second inputs, the first differential switching amplifier having a first output and the second differential switching amplifier having a second output;

means for supplying a different reference potential to the first input of each of the first and second differential switching amplifiers;

means coupling the second inputs of the first and second differential switching amplifiers in common to the first junction so that the states of operation of the first and second differential switching amplifiers are dependent upon the reference potentials applied to the first inputs thereof and upon the charge stored by the charge storage means;

switch means having first and second states of operation and having first and second inputs connected respectively to the first and second outputs of the first and second differential switching amplifiers and responsive to an output signal on the first output from the first differential switching amplifier to be driven to the first state of operation and responsive to an output signal on the second output of the second differential switching amplifier to be driven to the second state of operation; and means coupling the output of the switch means with one of the current sources for enabling such one current source with the switch means in the first state of operation and for disabling such one current source with the switch means in the second state of operation.

8. The combination according to claim 7 wherein the first differential switching amplifier includes first and second transistors of a first conductivity type, each transistor having base, collector, and emitter electrodes, with the bases of the first and second transistors comprising the first and second inputs, respectively, to the first switching amplifier, and the emitter electrodes thereof being connected together in common; and the second differential switching amplifier comprises third and fourth transistors of an opposite conductivity type to the conductivity type of the first and second transistors, the third and fourth transistors each having base, collector, and emitter electrodes, with the bases of the third and fourth transistors comprising the first and second inputs, respectively, to the second switching amplifier, and the emitter electrodes of the third and fourth transistors being coupled together in common; the combination further including:

a common load impedance interconnecting the emitter electrodes of the first and second transistors with the emitter electrodes of the third and fourth transistors;

means coupling the collector electrodes of the first and second transistors with the first supply terminal; and means coupling the collector electrodes of the third and fourth transistors with the second supply terminal, the collector electrode of one of the first and second transistors being connected to the switch means and comprising the output of the first differential switching amplifier and the collector electrode of one of the third and fourth transistors being connected to the switch means and comprising the output of the second differential switching amplifier.

9. The combination according to claim 7 wherein said first current source supplies current to said charge storage means in a direction to increase the charge stored thereby and said second current source conducts current in a direction to remove charge from said charge storage means.

10. The combination according to claim 9 wherein said first current source includes a first current source transistor of a first conductivity type and said second current source includes a second current source transistor of opposite conductivity type, said first and second current source transistors each having base, collector, and emitter electrodes, with the collector electrodes thereof being connected in common to the first junction, and the emitter electrodes thereof being coupled in circuit, respectively, with the first and second supply terminals, and means coupled to the bases of the first and second current source transistors to establish the conductivity thereof.

11. The combination according to claim 10 wherein the means for enabling and disabling said one current source couples the output of the switch means with the second current source transistor and renders the second current source transistor conductive with the switch means in its first state of operation and renders the second current source transistor nonconductive with the switch means in its second state of operation.

* * * * *